(12) United States Patent
Schwartz et al.

(10) Patent No.: US 10,782,809 B2
(45) Date of Patent: Sep. 22, 2020

(54) DISPLAY AND DETECTION SYSTEM

(71) Applicant: ISORG, Grenoble (FR)

(72) Inventors: Wilfrid Schwartz, Grenoble (FR);
Agathe Puszka, Grenoble (FR);
Quentin Chable, Grenoble (FR);
Benjamin Bouthinon, Grenoble (FR)

(73) Assignee: ISORG, Grenoble (FR)

( * ) Notice: Subject to any disclaimer, the term of this patent is extended or adjusted under 35 U.S.C. 154(b) by 0 days.

(21) Appl. No.: 16/058,452

(22) Filed: Aug. 8, 2018

(65) Prior Publication Data

US 2019/0050095 A1 Feb. 14, 2019

(30) Foreign Application Priority Data

Aug. 11, 2017 (FR) ...................... 17 57672

(51) Int. Cl.
*G06F 3/041* (2006.01)
*G02F 1/1335* (2006.01)
*H01L 27/32* (2006.01)
*H01L 27/30* (2006.01)
*G06F 3/042* (2006.01)

(52) U.S. Cl.
CPC ...... *G06F 3/0412* (2013.01); *G02F 1/133528* (2013.01); *G06F 3/042* (2013.01); *G06F 3/0416* (2013.01); *H01L 27/307* (2013.01); *H01L 27/323* (2013.01); *H01L 27/3227* (2013.01); *H01L 27/3232* (2013.01); *H01L 27/3234* (2013.01); *H01L 27/3269* (2013.01); *G02F 2001/133541* (2013.01); *G02F 2203/62* (2013.01)

(58) Field of Classification Search
CPC ..... G02F 1/133553; G02F 2001/13312; G02F 1/133528; G02F 1/13363; G02F 2001/133541; G02B 5/3025; G02B 5/30; G02B 1/11; G02B 2027/0138; G06K 9/209; G06F 3/042; G06F 3/041; H01L 27/3234

See application file for complete search history.

(56) References Cited

U.S. PATENT DOCUMENTS

| | | | |
|---|---|---|---|
| 9,570,002 B2 | 2/2017 | Sakariya et al. | |
| 9,647,041 B2 | 5/2017 | Liu et al. | |
| 2008/0246708 A1 | 10/2008 | Ishiguro | |
| 2013/0127374 A1 | 5/2013 | Lin et al. | |
| 2015/0095816 A1* | 4/2015 | Pan | G06F 3/0481 715/765 |
| 2015/0169094 A1* | 6/2015 | Liu | G06F 3/044 345/173 |

(Continued)

FOREIGN PATENT DOCUMENTS

EP 3012865 A1 4/2016

OTHER PUBLICATIONS

Search Report issued in French patent application No. 17567672., dated Apr. 16, 2018.

(Continued)

*Primary Examiner* — Sanjiv D. Patel
(74) *Attorney, Agent, or Firm* — Kaplan Breyer Schwarz, LLP

(57) ABSTRACT

A display and detection system including an image sensor, a display screen and an antireflection system covering the display screen and the image sensor, such an antireflection system including an electrically-controllable rectilinear polarizer.

15 Claims, 2 Drawing Sheets

(56) References Cited

U.S. PATENT DOCUMENTS

| | | | |
|---|---|---|---|
| 2016/0148036 A1* | 5/2016 | Kim | G06K 9/0002 |
| | | | 382/124 |
| 2017/0069692 A1 | 3/2017 | Lee et al. | |
| 2018/0375065 A1* | 12/2018 | Hashimoto | G02B 5/305 |
| 2019/0051709 A1* | 2/2019 | Puszka | G06K 9/0004 |
| 2019/0228204 A1* | 7/2019 | Park | F21V 5/02 |

OTHER PUBLICATIONS

Office Action issued in counterpart European patent application No. 18186413.3, dated Jul. 25, 2019, 8 pp.

* cited by examiner

DISPLAY AND DETECTION SYSTEM

This application claims the priority benefit of French patent application number 17/57672, the content of which is hereby incorporated by reference in its entirety to the maximum extent allowable by law.

BACKGROUND

The present disclosure concerns a display and detection system, and more particularly a display system associated with an image sensor.

DISCUSSION OF THE RELATED ART

For certain applications, it is desirable to be able to detect a fingerprint of a user by means of a fingerprint sensor integrated to a display screen. As an example, a display provided with a fingerprint sensor might equip cell phones. There exist display and detection systems comprising a display screen and an optical image sensor which might enable to form a fingerprint sensor. U.S. Pat. No. 9,570,002 describes an example of such a display and detection system comprising a display screen and an infrared image sensor.

Most display screens are partially reflective and it is necessary, for the user's comfort, to attenuate possible reflections. Thus, such display screens are generally equipped with an antireflection system. An example of antireflection system is described in relation with FIG. 1.

FIG. 1 is an exploded simplified view of a partially reflective display screen 1 covered with an antireflection system 3.

Antireflection system 3 is positioned in front of display screen 1. Antireflection system 3 comprises a rectilinear polarizer 5 and a quarter-wave plate 7. Quarter-wave plate 7 is positioned between rectilinear polarizer 5 and display screen 1. The axes of quarter-wave plate 7 are oriented by 45 degrees relative to the axis of rectilinear polarizer 5.

An antireflection system of this type operates as follows. An incident non-polarized light beam $R_i$ crosses, in the first place, rectilinear polarizer 5 and becomes a light beam $R_1$ with a rectilinear polarization. Quarter-wave plate 7 then turns light beam $R_1$ into a light beam $R_2$ with a right-handed or left handed circular polarization. Beam $R_2$ is partially reflected by display screen 1 into a reflected light beam $R_3$. The reflected light beam $R_3$ has a circular biasing inverse to that of light beam $R_2$, that is, left-handed or right-handed. Quarter-wave plate 7 then turns light beam $R_3$ into a light beam $R_4$ with a rectilinear polarization. The polarization direction of light beam $R_4$ is then orthogonal to that of light beam $R_1$. Polarizer 5 then prevents light beam $R_4$ from passing.

It would be desirable to form a display system equipped with an antireflection system comprising an optical image sensor, for example, a fingerprint sensor.

SUMMARY

Thus, an embodiment provides a display and detection system comprising:
an image sensor;
a display screen; and
an antireflection system covering the display screen and the image sensor, the antireflection system comprising an electrically-controllable rectilinear polarizer.

According to an embodiment, the antireflection system further comprises a quarter-wave plate.

According to an embodiment, the electrically controllable rectilinear polarizer is a liquid crystal polarizer.

According to an embodiment, the display screen covers the image sensor.

According to an embodiment, the display screen comprises a light-emitting layer and an encapsulation layer covering the light-emitting layer.

According to an embodiment, the light-emitting layer is an OLED-type layer.

According to an embodiment, the display screen comprises a transparent substrate having the light-emitting layer resting thereon.

According to an embodiment, the antireflection layer is covered with a transparent coating.

According to an embodiment, the transparent coating is made of glass.

According to an embodiment, the image sensor comprises an array of organic sensors.

According to an embodiment, the system further comprises an angular filter, between the image sensor and the display screen, capable of blocking the incident rays having an incidence relative to a direction orthogonal to a surface of the angular filter greater than a threshold and of letting through at least certain incident rays having an incidence relative to a direction orthogonal to the surface smaller than the threshold.

An embodiment also provides using the display and detection system such as previously defined for the detection of at least one fingerprint of a user.

According to an embodiment, the image sensor plays the role of a touch surface.

An embodiment also provides a method of controlling the display and detection system such as previously defined, wherein the electrically-controllable rectilinear polarizer is deactivated on each use of the image sensor.

The foregoing and other features and advantages will be discussed in detail in the following non-limiting description of specific embodiments in connection with the accompanying drawings.

DETAILED DESCRIPTION

Figure 1:
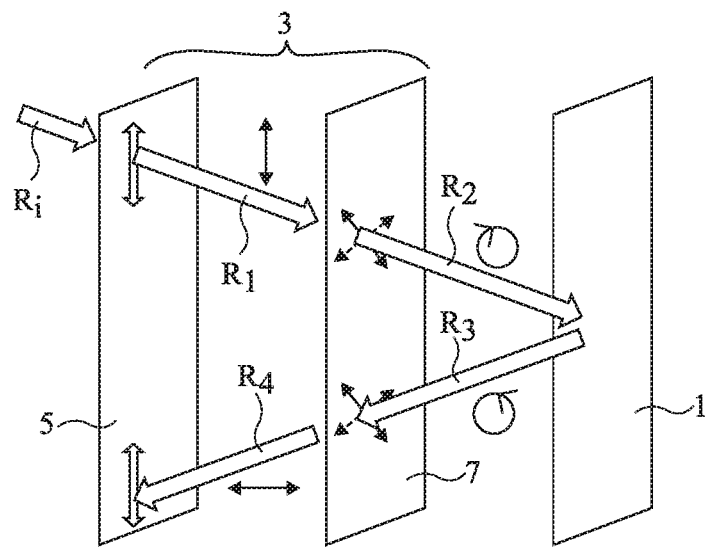
FIG. 1, previously described, illustrates an antireflection system.

The same elements have been designated with the same reference numerals in the different drawings. For clarity, only those steps and elements which are useful to the understanding of the described embodiments have been shown and are detailed.

In the following description, when reference is made to terms qualifying the relative position, such as term "top", reference is made to the orientation of the drawings. The term "approximately" is used herein to designate a tolerance of plus or minus 10%, preferably plus or minus 5%, of the value in question.

In the following description, "visible light" designates an electromagnetic radiation having a wavelength in the range from 400 nm to 700 nm and "infrared radiation" designates an electromagnetic radiation having a wavelength in the range from 700 nm to 10 μm.

A pixel of an image corresponds to the unit element of the image displayed by a display screen. When the display screen is a color image display screen, it generally comprises, for the display of each image pixel, at least three emission and/or light intensity regulation components, also called display sub-pixels, which each emit a light radiation substantially in a single color (for example, red, green, or blue). The superposition of the radiations emitted by the three display sub-pixels provides the observer with the colored sensation corresponding to the pixel of the displayed image. In this case, the assembly formed by the three display sub-pixels used to display a pixel of an image is called display pixel of the display screen.

Figure 2:
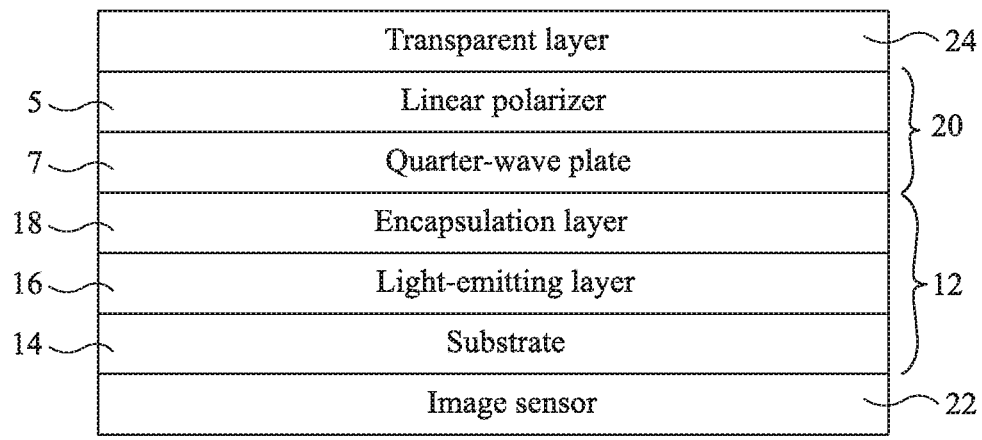
FIG. 2 is a simplified diagram of a display and detection system.

FIG. 2 is a simplified diagram of a display and detection system 10 capable of displaying an image and of detecting an image, for example, a fingerprint.

Display and detection system 10 comprises a display screen 12. Display screen 12 is for example formed of a stack successively comprising:

a transparent substrate 14, for example, made of a polymer or of glass;

a light-emitting layer 16 resting on substrate 14 and in contact therewith; and a transparent encapsulation layer 18, for example, made of a polymer, resting on light-emitting layer 16 and in contact therewith.

Substrate 14 and encapsulation layer 18 are transparent to visible light and to infrareds.

Light-emitting layer 16 comprises an array of display pixels. Each display pixel comprises an optoelectronic component capable of emitting an electromagnetic radiation, also called light-emitting component. Each light-emitting component for example corresponds to a light-emitting diode, particularly, to an organic light-emitting diode (OLED). The display pixels may further comprise conductive tracks and switching elements, particularly transistors, not shown, enabling to select display pixels.

Display and detection system 10 further comprises an antireflection system 20 of the type described in relation with FIG. 1. It shows rectilinear polarizer 5 and quarter-wave plate 7. Antireflection system 20 is arranged on top of and in contact with display screen 12, that is, quarter-wave plate 7 rests on top of and in contact with encapsulation layer 18 of display screen 12.

Display and detection system 10 further comprises an image sensor 22. As an example, image sensor 22 is located under display screen 12, that is, substrate 14 of display screen 12 rests on top of and in contact with image sensor 22. Image sensor 22 comprises an array of photon sensors, or photodetectors. The photodetectors are arranged so that an incident radiation reaches them after having crossed display screen 14. As an example, the photodetectors are positioned at the level of the interstices between the display pixels of light-emitting layer 16 to receive a light radiation passing between the display pixels. The photodetectors may be covered with a transparent protection coating, not shown. Image sensor 22 further comprises conductive tracks and switching elements, particularly transistors, not shown, enabling to select the photodetectors. The photodetectors may be made of organic materials. The photodetectors may correspond to organic photodiodes (OPD) or to organic photoresistors.

As an example, image sensor 12 may be used to detect the fingerprint of at least one finger of a user. Preferably, image sensor 12 may be used to simultaneously detect the fingerprints of a plurality of fingers of the user. According to an embodiment, image sensor 12 may play the role of a touch surface, where the location of an object or member on the display and detection system 10 is determined by the photodetectors. Display and detection system may then be used as a controllable interactive user interface by simple sliding of the finger or of the hand on the touch surface. Such an interactive user interface may particularly be used to control cells phones, computers, television sets, motor vehicles, automated ticketing machines, industrial equipment, medical equipment, etc.

Display and detection system 10 further comprises a transparent protection coating 24 resting on top of and in contact with antireflection system 20. This coating is transparent to visible light and to infrareds. Protection coating 24 is for example a glass plate or a transparent layer made of a polymer.

According to a first embodiment, an object or member, for example, a finger, may be illuminated by a source external to the display and detection system, which emits a radiation which crosses or is reflected by the object or member. The object or member then emits a non-polarized light radiation towards the photodetectors of image sensor 22. Such a non-polarized radiation crosses polarizer 5 and 50% of its intensity is lost.

According to a second embodiment, the object or member is not illuminated by an external source, it is then illuminated by a non-polarized light radiation emitted by light-emitting layer 16 of display screen 12. The light radiation polarizes and loses part of its intensity by crossing polarizer 5. Such a light radiation reflects on the object or member and is reflected. The reflected radiation crosses polarizer 5 and loses again part of its intensity.

Thus, a disadvantage of such a display and detection system 10 is that the polarizer 5 of antireflection system 20 decreases the luminosity of the image of the object or member on image sensor 22.

Figure 3:
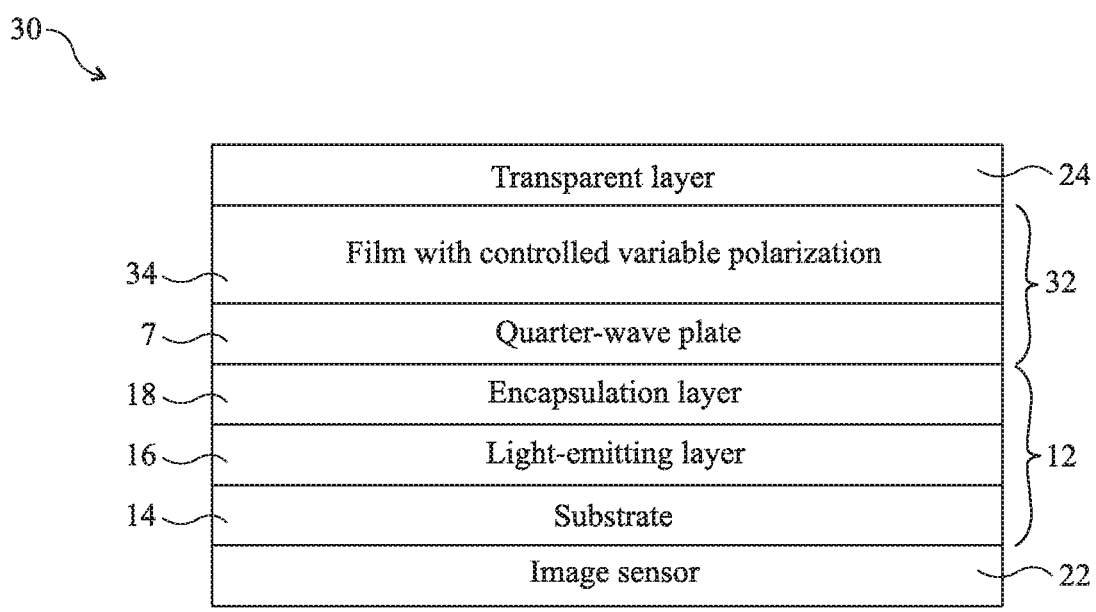
FIG. 3 is a simplified electric diagram of an embodiment of a display and detection system.

FIG. 3 is a simplified diagram of an embodiment of a display and detection system 30 capable of detecting an image, for example, a fingerprint. Display and detection system 30 comprises some of the elements of display and detection system 10 described in relation with FIG. 2, that is, display screen 12, comprising substrate 14, light-emitting layer 16, and encapsulation layer 18, image sensor 22, and a transparent layer 24.

Display and detection system 30 further comprises an antireflection system 32 comprising the quarter-wave plate 7 described in relation with FIG. 2 and an electrically controllable rectilinear polarizer 34. An electrically controllable rectilinear polarizer is a polarizer which, under the influence of an electric field, may either become polarizing or lose its polarizing character.

An example of an electrically-controllable rectilinear polarizer is a liquid crystal polarizer. Liquid crystals are sensitive to the influence of an electric field. In the case of nematic liquid crystals, the liquid crystals are not polarizing in the idle state. When an electric field is applied thereto, the liquid crystals organize and become polarizing. In the case of cholesteric liquid crystals, the liquid crystals are polarizing in the idle state. When an electric field is applied thereto, the liquid crystals lose their polarizing character.

A circuit for controlling rectilinear polarizer 34 can then be provided. Such a control circuit may comprise a switch which, according to the type of liquid crystals forming the polarizer, opens or closes to apply or not an electric field to rectilinear polarizer 34. Such a switch may be controlled manually or by a signal emitted each time the image sensor is desired to be used, for example, to acquire a fingerprint.

An advantage of this embodiment is that rectilinear polarizer 34 can be activated or deactivated at will. When the image sensor is desired to be used, rectilinear polarizer 34 is deactivated so that it no longer polarizes the light crossing it. In the case of a polarizer with nematic liquid crystals, the deactivation of rectilinear polarizer 34 is obtained by interrupting the application of an electric field on the liquid crystals so that they lose their polarizing character. In the case of a polarizer with cholesteric liquid crystals, the deactivation of rectilinear polarizer 34 is obtained by submitting the liquid crystals to an electric field so that they lose their polarizing character. The luminosity of the image generated by the sensor is then not decreased by rectilinear polarizer 34.

When display screen 12 is desired to be used alone without image sensor 22, rectilinear polarizer 34 is activated so that it polarizes the light crossing it. Antireflection system 32 then operates like that described in relation with FIG. 1 and eliminates possible reflections of display and detection system 30.

Specific embodiments have been described. Various alterations and modifications will occur to those skilled in the art. In particular, the light intensity of the display, may adapt on each activation or deactivation of rectilinear polarizer 34 to respect standards relative to the maximum illumination of a display.

The display and detection system may comprise a touch surface in addition to image sensor 22 which may then be dedicated to the acquisition of fingerprints.

In the previously-described embodiments, display screen 12 covers image sensor 22. As a variation, the image sensor may be formed directly at the level of the emitting layer in the display screen, for example, by arranging the photodetectors in the interstices between the display pixels in light-emitting layer 16.

Further, the display and detection system may further comprise an angular filter arranged between display screen 12 and image sensor 22. The angular filter is capable of filtering the incident radiation according to the incidence of the radiation relative to the upper surface of the angular filter, particularly so that image sensor 22 only receives the rays having an incidence relative to an axis perpendicular to the upper surface of the angular filter smaller than a maximum angle of incidence smaller than 45°, preferably smaller than 30°, more preferably smaller than 20°, more preferably still smaller than 10°. Angular filter 16 is capable of blocking the rays of the incident radiation having an incidence relative to an axis perpendicular to the upper surface of the angular filter greater than the maximum angle of incidence. The angular filter may comprise an array of holes delimited by walls opaque to said radiation.

Various embodiments with different variations have been described hereabove. It should be noted that those skilled in the art may combine various elements of these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A display and detection system comprising:
   an image sensor;
   a display screen; and
   an antireflection system covering the display screen and the image sensor, the antireflection system comprising an electrically-controllable rectilinear polarizer;
   wherein the electrically controllable rectilinear polarizer can be deactivated prior to use of the image sensor.

2. The display and detection system of claim 1, wherein the antireflection system further comprises a quarter-wave plate.

3. The display and detection system of claim 1, wherein the electrically-controllable rectilinear polarizer is a liquid crystal polarizer.

4. The display and detection system of claim 1, wherein the display screen covers the image sensor.

5. The display and detection system of claim 1, wherein the display screen comprises a light-emitting layer and an encapsulation layer covering the light emitting layer.

6. The display and detection system of claim 5, wherein the light-emitting layer is an OLED-type layer.

7. The display and detection system of claim 5, wherein the display screen comprises a transparent substrate having the light-emitting layer resting thereon.

8. The display and detection system of claim 1, wherein the antireflection system is covered with a transparent coating.

9. The display and detection system of claim 8, wherein the transparent coating is made of glass.

10. The display and detection system of claim 1, wherein the image sensor comprises an array of organic sensors.

11. The display and detection system of claim 1, further comprising an angular filter, between the image sensor and the display screen, capable of blocking incident rays having an incidence relative to a direction orthogonal to a surface of the angular filter greater than a threshold and of letting through at least certain incident rays having an incidence relative to a direction orthogonal to the surface smaller than the threshold.

12. The display and detection system of claim 1, wherein the system detects at least one fingerprint of a user.

13. The display and detection system of claim 12, wherein the image sensor comprises a touch surface for a finger of the user.

14. A method for using a display and detection system, the method comprising:
   providing the system with an image sensor, a display screen, and an antireflection system covering the display screen and the image sensor, the antireflection system including an electrically-controllable rectilinear polarizer;
   deactivating the electrically controllable rectilinear polarizer; and
   detecting at least one fingerprint of a user with the image sensor.

15. A method for controlling a display and detection system comprising an image sensor, a display screen, and an antireflection system covering the display screen and the image sensor, the antireflection system including an electrically-controllable rectilinear polarizer, the method comprising:
   deactivating the electrically controllable rectilinear polarizer on each use of the image sensor.

* * * * *